US010658031B2

(12) United States Patent
Nagase

(10) Patent No.: US 10,658,031 B2
(45) Date of Patent: May 19, 2020

(54) SEMICONDUCTOR MEMORY DEVICE HAVING MEMORY CELL PAIRS DEFINING DATA BASED ON THRESHOLD VOLTAGES

(71) Applicant: Renesas Electronics Corporation, Koutou-ku, Tokyo (JP)

(72) Inventor: Hirokazu Nagase, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/112,655

(22) Filed: Aug. 25, 2018

(65) Prior Publication Data

US 2019/0139601 A1  May 9, 2019

(30) Foreign Application Priority Data

Nov. 9, 2017  (JP) ................................. 2017-216152

(51) Int. Cl.
*G11C 11/56* (2006.01)
*G11C 16/32* (2006.01)
*G11C 16/34* (2006.01)

(52) U.S. Cl.
CPC ...... *G11C 11/5642* (2013.01); *G11C 11/5628* (2013.01); *G11C 16/32* (2013.01); *G11C 16/349* (2013.01); *G11C 2211/5641* (2013.01); *G11C 2211/5644* (2013.01)

(58) Field of Classification Search
CPC ... G11C 11/5642; G11C 16/34; G11C 16/349; G11C 11/5628; G11C 16/32; G11C 2211/5644; G11C 2211/5641
See application file for complete search history.

(56) References Cited

U.S. PATENT DOCUMENTS

| 10,073,982 | B2* | 9/2018 | Sawada | ................... G06F 21/85 |
| 2002/0118573 | A1* | 8/2002 | Pasotti | ............... G11C 16/0441 |
| | | | | 365/185.24 |
| 2006/0239073 | A1 | 10/2006 | Toda | |
| 2007/0121376 | A1 | 5/2007 | Toda | |

FOREIGN PATENT DOCUMENTS

JP    2001-101879 A    4/2001

OTHER PUBLICATIONS

Extended European Search Report dated Jun. 25, 2019, in European Patent Application No. 18192298.0.

* cited by examiner

*Primary Examiner* — David Lam
(74) *Attorney, Agent, or Firm* — SGPatents PLLC

(57) ABSTRACT

To provide a semiconductor memory device capable of storing multi-value data while suppressing an increase in the threshold voltage set for a memory cell. A semiconductor memory device according to an embodiment includes a plurality of memory cell pairs, each having a first memory cell and a second memory cell. The first memory cell is configured so as to set at least one threshold voltage, whereas the second memory cell is configured so as to set a plurality of threshold voltages. Data stored in the memory cell pairs is defined using differences between the threshold voltages of the second memory cell and the threshold voltage of the first memory cell.

5 Claims, 15 Drawing Sheets

| THRESHOLD VOLTAGE | RANGE LOWER LIMIT | RANGE UPPER LIMIT | DATA |
|---|---|---|---|
| Vth1 | $V_0 - d_1$ | $V_0$ | 0 |
| Vth2 | $V_0 + r$ | $V_0 + A*(d_1+r)$ | 1 |
| Vth3 | $V_0 + A*(d_1+r) + r$ | $V_0 + A*(d_1+r) + A^2*(d_1+r)$ | 2 |

| ΔVth | RANGE LOWER LIMIT | RANGE UPPER LIMIT | DATA |
|---|---|---|---|
| ΔVth1=Vth2−Vth1 | $r$ | $A*r$ | 0 |
| ΔVth2=Vth3−Vth1 | $A*r+r$ | $A*(A*r+r)$ | 1 |
| ΔVth3=Vth4−Vth1 | $A*(A*r+r)+r$ | $A*[A*(A*r+r)+r]$ | 2 |

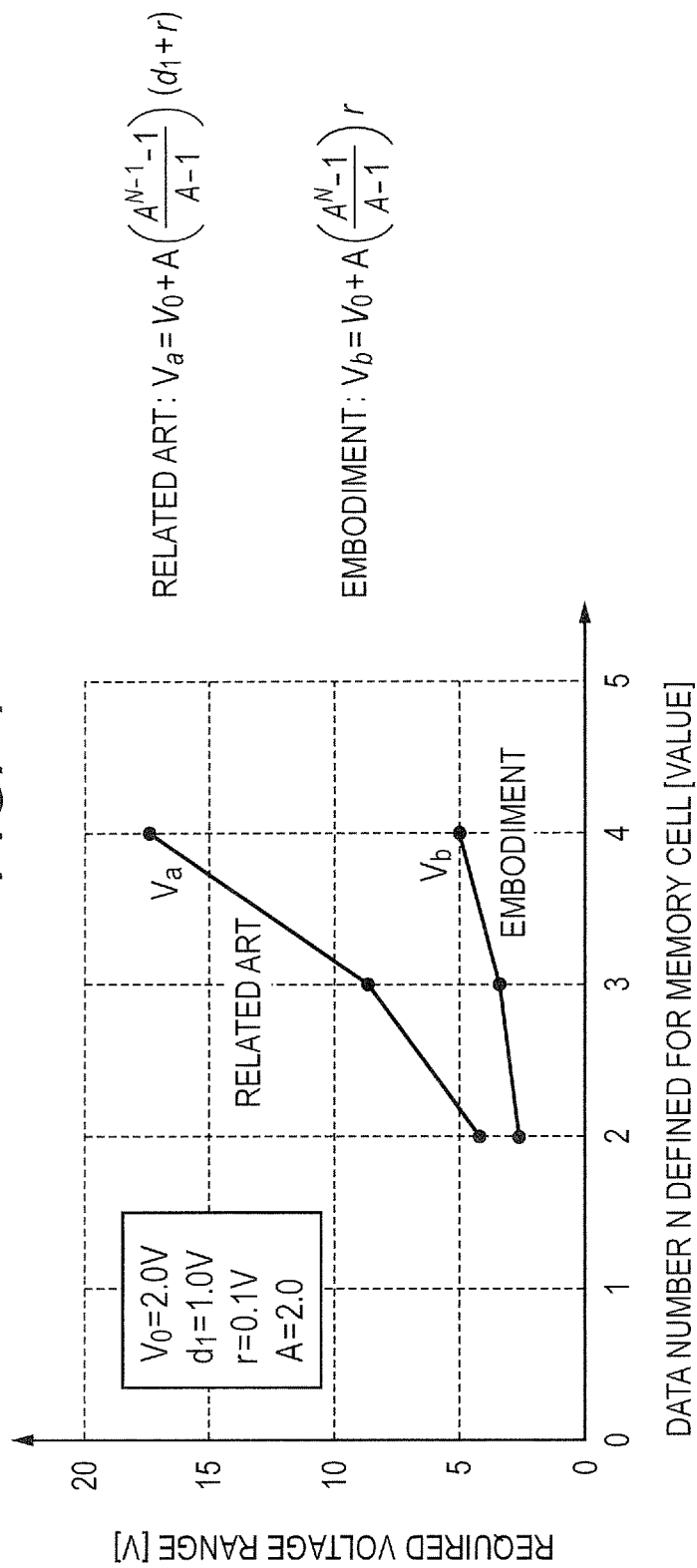

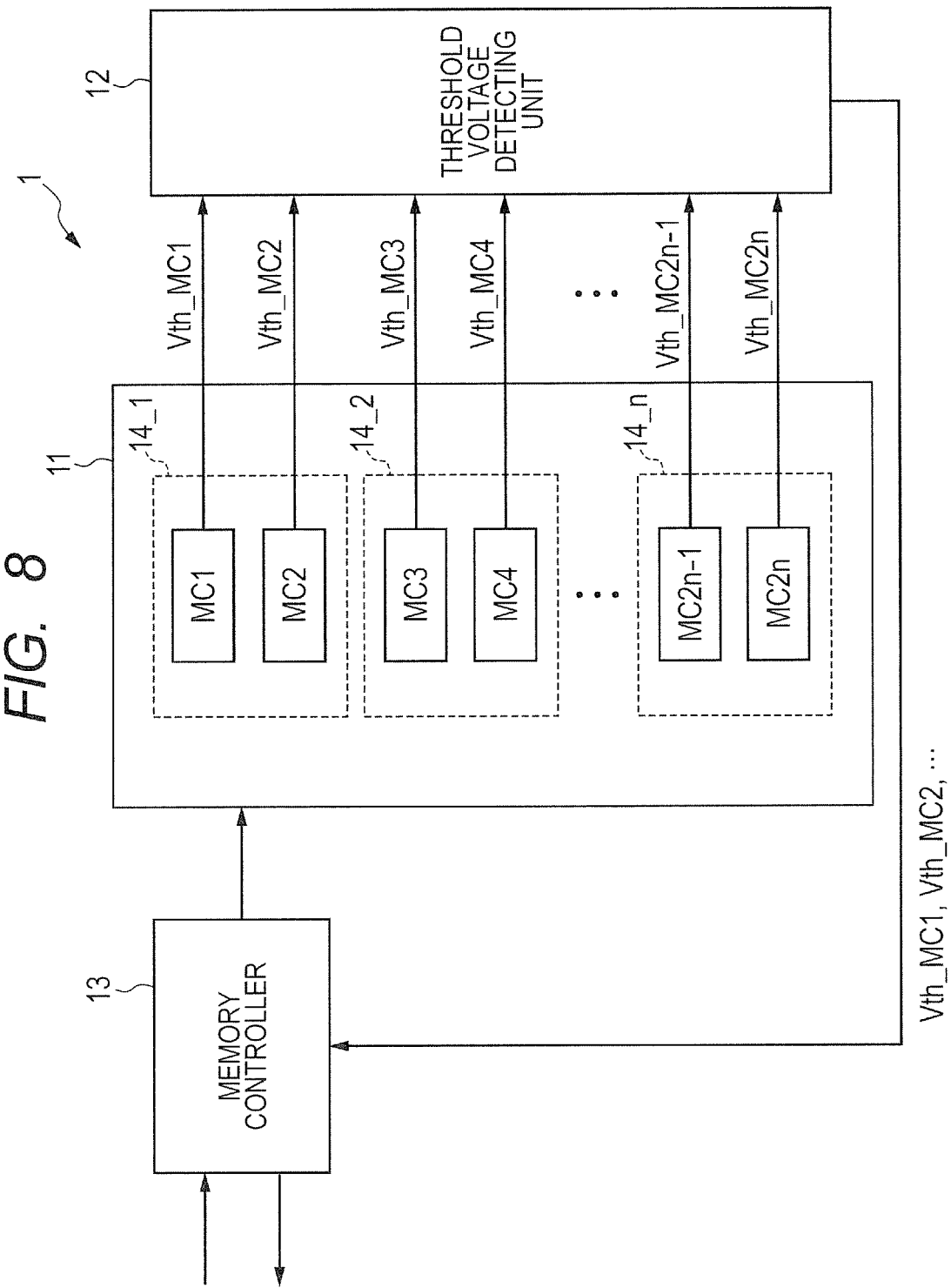

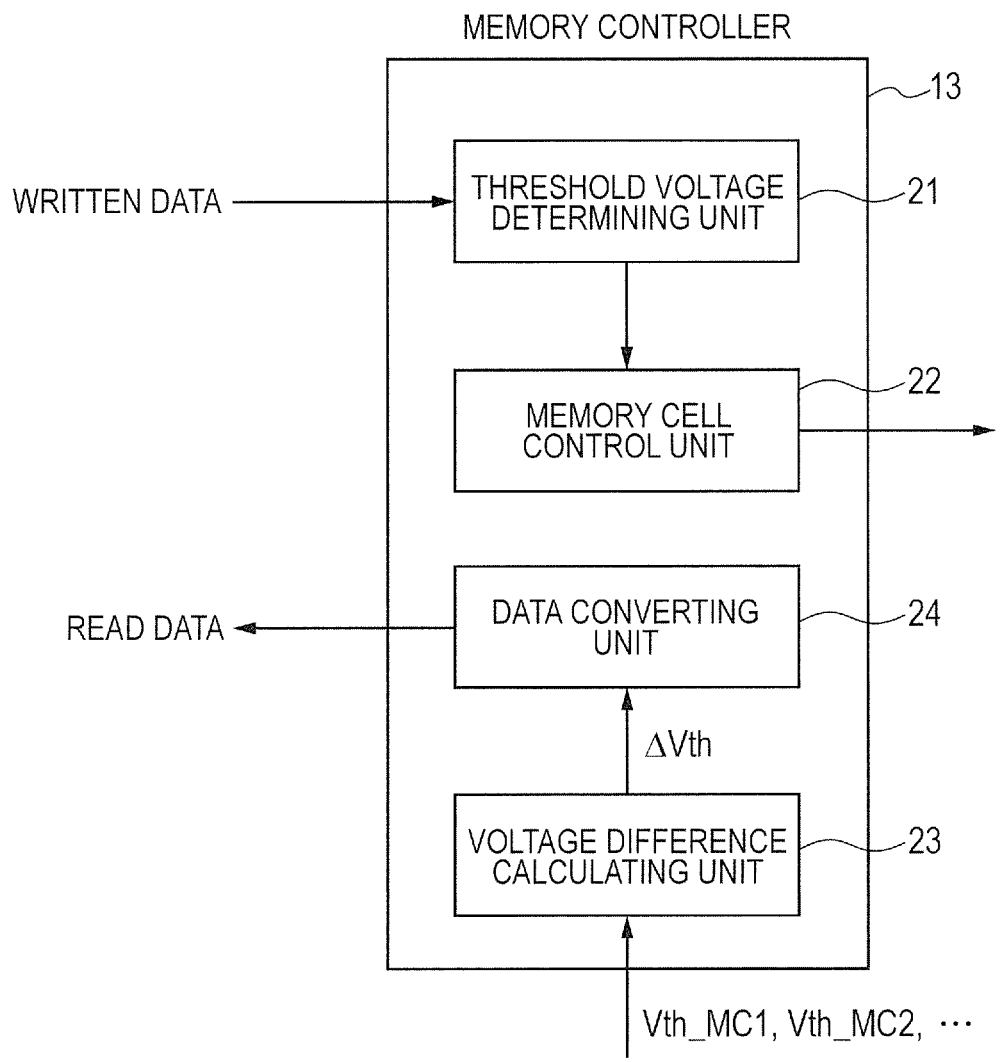

FIG. 13

|  |  | Vth OF MEMORY CELL A | | | |
|---|---|---|---|---|---|
|  |  | Vth1 | Vth2 | Vth3 | Vth4 |
| Vth OF MEMORY CELL B | Vth1 | INVALID | DATA 3 | DATA 4 | DATA 5 |
|  | Vth2 | DATA 0 | INVALID | INVALID | INVALID |
|  | Vth3 | DATA 1 | INVALID | INVALID | INVALID |
|  | Vth4 | DATA 2 | INVALID | INVALID | INVALID |

FIG. 14

|  |  | Vth OF MEMORY CELL A | | | |
|---|---|---|---|---|---|
|  |  | Vth1 | Vth2 | Vth3 | Vth4 |
| Vth OF MEMORY CELL B | Vth1 | INVALID | DATA 6 | DATA 7 | DATA 8 |
|  | Vth2 | DATA 0 | INVALID | DATA 9 | DATA 10 |
|  | Vth3 | DATA 1 | DATA 3 | INVALID | DATA 11 |
|  | Vth4 | DATA 2 | DATA 4 | DATA 5 | INVALID |

FIG. 15

| Vth OF MEMORY CELL A | Vth OF MEMORY CELL B | RANGE LOWER LIMIT | RANGE UPPER LIMIT | DATA |
|---|---|---|---|---|
| Vth1 | Vth2 | r | A*r | 0 |
| Vth1 | Vth3 | A*r+r | A*(A*r+r) | 1 |
| Vth1 | Vth4 | A*(A*r+r)+r | A*[A*(A*r+r)+r] | 2 |
| Vth2 | Vth3 | A*r | A*A*r | 3 |
| Vth2 | Vth4 | A*(A*r+r) | A*A*(A*r+r) | 4 |
| Vth3 | Vth4 | A*A*r | A*A*A*r | 5 |

SEMICONDUCTOR MEMORY DEVICE HAVING MEMORY CELL PAIRS DEFINING DATA BASED ON THRESHOLD VOLTAGES

CROSS-REFERENCE TO RELATED APPLICATIONS

The disclosure of Japanese Patent Application No. 2017-216152 filed on Nov. 9, 2017 including the specification, drawings and abstract is incorporated herein by reference in its entirety.

The present invention relates to a semiconductor memory device and a method of defining data in the semiconductor memory device and relates to, for example, a semiconductor memory device capable of storing multi-value data and a method of defining data in the semiconductor memory device.

BACKGROUND

In recent years, flash memory has been frequently used as a nonvolatile semiconductor memory device. A multivalued processing technique is used as a technique for achieving large-capacity flash memory. Japanese Unexamined Patent Application Publication No. 2001-101879 discloses a technique of storing multi-value data in a memory cell by setting multiple threshold voltages in the memory cell.

SUMMARY

In the technique disclosed in Japanese Unexamined Patent Application Publication No. 2001-101879, the range of possible threshold voltages in the single memory cell is divided into multiple areas and different data segments are allocated to the respective areas, thereby storing multi-value data in the single memory cell.

In this case, the threshold voltage in the memory cell changes from the initial value due to, for example, electrical discharge with the passage of time. Thus, in order to ensure the uniqueness of data, the ranges of threshold voltages with allocated data need to be extended so as to prevent the threshold voltages from entering other data areas.

However, if the ranges of threshold voltages with allocated data are extended, the value of a threshold voltage set for the memory cell may disadvantageously increase.

Other problems and new features will be clarified by the description and the accompanying drawings of the present specification.

A semiconductor memory device according to an embodiment includes a plurality of memory cell pairs, each having a first memory cell and a second memory cell. The first memory cell is configured so as to set at least one threshold voltage, whereas the second memory cell is configured so as to set a plurality of threshold voltages. Data stored in the memory cell pairs is defined using differences between the threshold voltages of the second memory cell and the threshold voltage of the first memory cell.

The embodiment can provide a semiconductor memory device capable of storing multi-value data while suppressing an increase in the threshold voltage set for a memory cell, and a method of defining data in the semiconductor memory device.

BRIEF DESCRIPTION OF THE DRAWINGS

FIG. 7 shows simulation results of the relationship between the number of data segments defined for the memory cell and a required voltage range;

FIG. 8 is a block diagram showing a configuration example of the semiconductor memory device according to the first embodiment;

FIG. 9 is a block diagram showing a configuration example of a memory controller included in the semiconductor memory device according to the first embodiment;

FIG. 10 is a table showing the example of data definition in the semiconductor memory device according to the first embodiment;

FIG. 13 is a table showing an example of data definition in a semiconductor memory device according to a second embodiment;

FIG. 14 is a table showing an example of data definition in a semiconductor memory device according to a third embodiment;

FIG. 15 is a table showing an example of data definition in the semiconductor memory device according to the third embodiment;

DETAILED DESCRIPTION

<Explanation of the Related Art>

First, a semiconductor memory device according to the related art will be discussed below. The semiconductor memory device according to the related art is, for example, a flash memory. The threshold voltage of the flash memory changes according to the quantity of electric charge flowing to a floating gate provided for each memory cell. Specifically, the larger the quantity of electric charge flowing to the floating gate, the higher the threshold voltage. In the semiconductor memory device according to the related art, the quantity of charge flowing to a floating gate is adjusted and multiple threshold voltages are set for a memory cell, thereby storing multi-value data in the memory cell.

Figure 1:
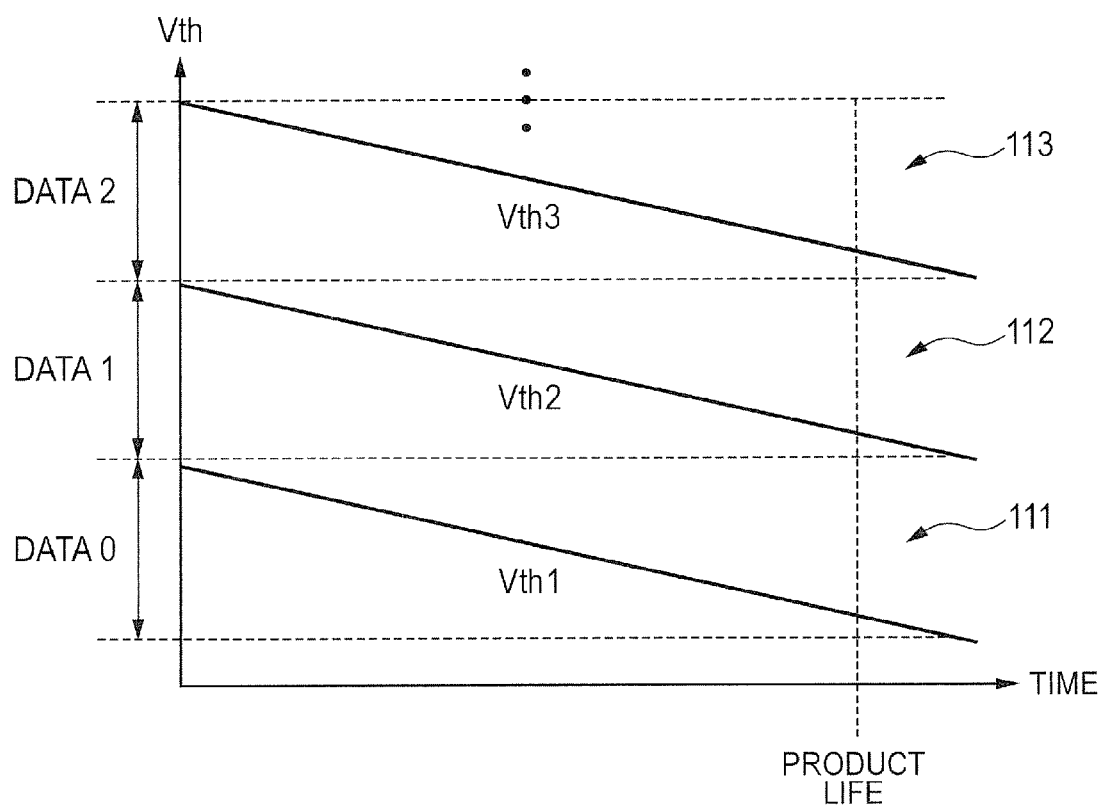
FIG. 1 shows an example of data definition in a semiconductor memory device according to the related art.

FIG. 1 shows an example of data definition in the semiconductor memory device according to the related art. As shown in FIG. 1, in the related art, the range of possible threshold voltages in the single memory cell is divided into areas 111 to 113 and different data 0 to 2 are allocated to the respective areas 111 to 113, thereby storing multi-value data in the single memory cell. In FIG. 1, the data 0 is allocated to the area 111 corresponding to a threshold voltage Vth1, the data 1 is allocated to the area 112 corresponding to a threshold voltage Vth2, and the data 2 is allocated to the area 113 corresponding to a threshold voltage Vth3.

In this case, the threshold voltage in the memory cell changes from the initial value due to, for example, electrical discharge with the passage of time. In other words, as shown in FIG. 1, the threshold voltages Vth1 to Vth3 gradually decrease with the passage of time immediately after writing to the memory cell. Thus, in order to ensure the uniqueness of data, the ranges of threshold voltages Vth1 to Vth3 where the data 0 to 2 are allocated need to be extended (See the data areas 111 to 113) so as to prevent the threshold voltages Vth1 to Vth3 from entering other data areas. In other words, in consideration of reductions in the threshold voltages Vth1 to Vth3, the data areas 111 to 113 for the data 0 to 2 are allocated such that the threshold voltages Vth1 to Vth3 do not overlap other data areas in a product life.

Figures 2, 3:
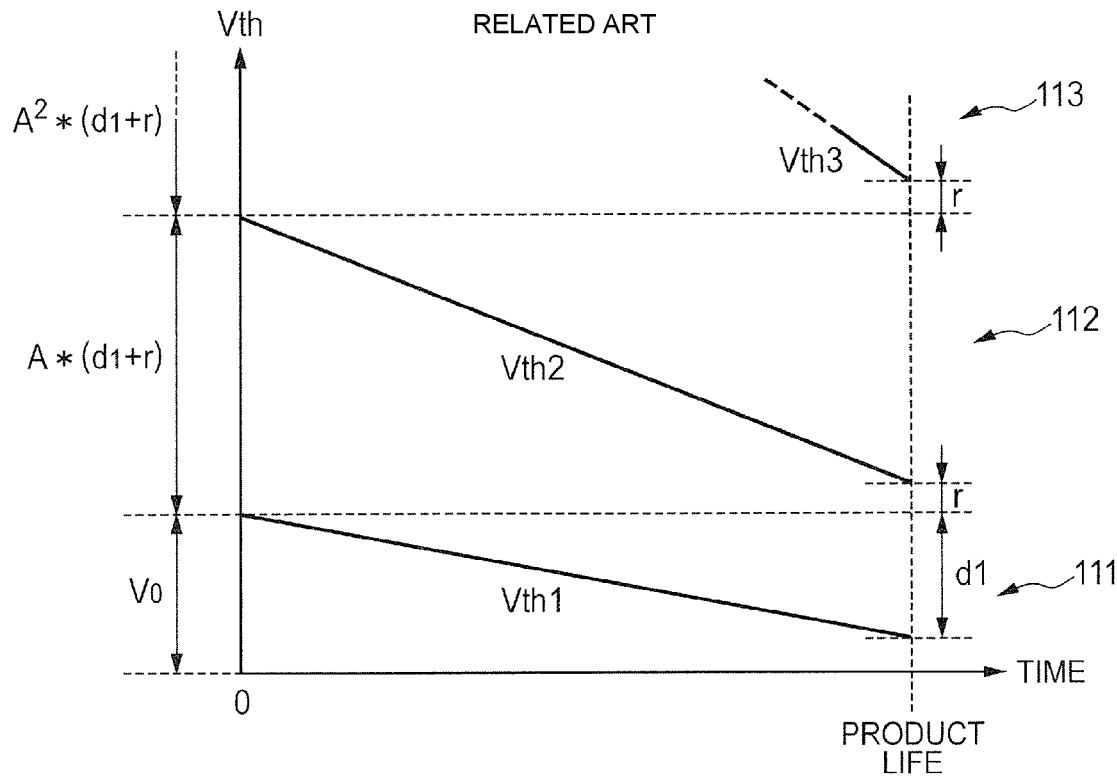
FIG. 2 shows an example of data definition in the semiconductor memory device according to the related art.
FIG. 3 is a table showing an example of data definition in the semiconductor memory device according to the related art.

FIG. 2 shows an example of data definition in the semiconductor memory device according to the related art. For the sake of convenience, FIG. 1 shows the equally decreasing threshold voltages. Actually, as shown in FIG. 2, a higher threshold voltage decreases at a more rapid pace. Specifically, a large quantity of electric charge flows to the floating gate at a high threshold voltage and thus the quantity of electric discharge from the floating gate increases with the passage of time. Hence, a higher threshold voltage increases the quantity of electric discharge and decreases at a more rapid pace.

In the example of data definition in FIG. 2, the range upper limit and the range lower limit of threshold voltages Vth are defined (In the present specification, threshold voltages Vth1, Vth2, and the like are collectively referred to as "threshold voltage Vth").
In this case, the range upper limit is a threshold voltage value obtained immediately after writing to the memory cell (time=0) and the range lower limit is a threshold voltage value obtained at the end of the product life of the memory cell.

Specifically, in the example of data definition in FIG. 2, the range upper limit and the range lower limit of threshold voltages Vth are defined using an initial (immediately after writing) voltage value $V_0$ of the threshold voltage Vth1, a fluctuation (retention fluctuation) $d_1$ of the threshold voltage Vth1 from immediately after writing to the end of the product life, a resolution r, and a difference reduction rate A. In this case, the resolution r corresponds to a difference between the range upper limit of a threshold voltage Vth_N (N is a natural number) and the range lower limit of a threshold voltage Vth_N+1. The resolution r is defined as a constant value regardless of the value of N.

The difference reduction rate A is the ratio of a difference between the range upper limits of two adjacent threshold voltages to a difference between the range lower limits of the two adjacent threshold voltages. Specifically, the difference reduction rate A=a/b can be defined where a is a difference between the range upper limit of the threshold voltage Vth_N (N is a natural number) and the range upper limit of the threshold voltage Vth_N+1 and b is a difference between the range lower limit of the threshold voltage Vth_N (N is a natural number) and the range lower limit of the threshold voltage Vth_N+1. The difference reduction rate A is defined as a constant rate regardless of the value of N.

According to the definition, as shown in FIGS. 2 and 3, the range lower limit of the threshold voltage Vth1 can be defined as "$V_0-d_1$", the range upper limit can be defined as "$V_0$", and the data of the range can be defined as "0". Furthermore, the range lower limit of the threshold voltage Vth2 can be defined as "$V_0+r$", the range upper limit can be defined as "$V_0+A*(d_1+r)$", and the data of the range can be defined as "1". Moreover, the range lower limit of the threshold voltage Vth3 can be defined as "$V_0+A*(d_1+r)+r$", the range upper limit can be defined as "$V_0+A*(d_1+r)+A^{2}*(d_1+r)$", and the data of the range can be defined as "2".

FIG. 3 shows a definition example of ternary data. A necessary voltage range for each memory cell corresponds to the range upper limit of the threshold voltage Vth3 and thus is defined as "$V_0+A*(d_1+r)+A^2*(d_1+r)$".

In the generalization of the definition, a voltage range $V_a$ necessary for defining N-value data in each memory cell can be expressed by equation (1) below:

[Equation 1]

$$V_a = V_0 + A\left(\frac{A^{N-1}-1}{A-1}\right)(d_1 + r) \qquad (1)$$

In equation (1), the voltage range $V_a$ necessary for defining N-value data in each memory cell is proportionate to the fluctuation $d_1$ of the threshold voltage Vth1 (i.e., a retention fluctuation). Thus, the voltage range $V_a$ necessary for defining N-value data in each memory cell tends to increase.

In the semiconductor memory device according to the related art, in order to suppress the influence of a temporal change of the threshold voltage of the memory cell, the ranges of threshold voltages with allocated data (See the data areas 111 to 113) are extended so as to prevent the threshold voltages from entering other data areas. In this way, if the ranges of threshold voltages with allocated data are extended, the value of a threshold voltage set for the memory cell disadvantageously increases.

In order to solve the problem of the related art, in semiconductor memory devices according to the following embodiments, data is defined as follows: Specifically, the semiconductor memory devices according to the embodiments include memory cell pairs, each having a first memory cell and a second memory cell. The first memory cell is configured so as to set at least one threshold voltage, whereas the second memory cell is configured so as to set a plurality of threshold voltages. Data segments stored in the memory cell pairs are each defined using a difference between the threshold voltage of the second memory cell and the threshold voltage of the first memory cell.

The semiconductor memory devices and methods of defining data in the semiconductor memory devices according to the embodiments will be specifically described below.

First Embodiment

Figure 4:
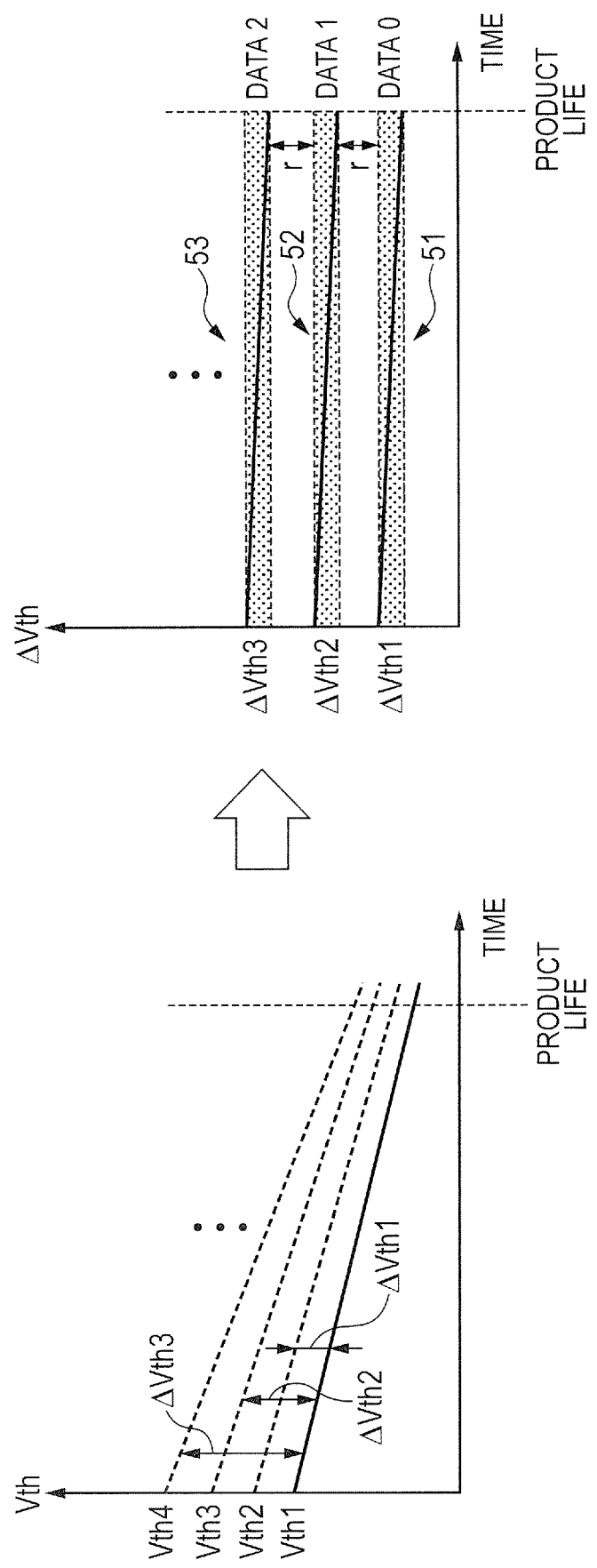
FIG. 4 shows an example of data definition in a semiconductor memory device according to a first embodiment.

FIG. 4 shows an example of data definition in the semiconductor memory device according to a first embodiment.

In the semiconductor memory device according to the present embodiment, a memory cell pair including a memory cell A and a memory cell B is used as a memory unit. Multi-value data is stored in the memory unit (memory cell pair). Specifically, a reference threshold voltage Vth1 is set for the memory cell A and threshold voltages Vth2 to Vth4 are set for the other memory cell B. The data is defined using differences ΔVth1 to ΔVth3 between the threshold voltages Vth2 to Vth4 of the memory cell B and the threshold voltage Vth1 of the memory cell A.

As shown in FIG. 4, the threshold voltages Vth1 to Vth4 are set so as to increase in the order of the threshold voltage Vth1, the threshold voltage Vth2, the threshold voltage Vth3, and the threshold voltage Vth4. The threshold voltages Vth1 to Vth4 are positive values. Moreover, the voltage differences are set so as to increase in the order of the threshold voltage difference ΔVth1, the threshold voltage difference ΔVth2, and the threshold voltage difference ΔVth3.

As indicated on the right side of FIG. 4, in the semiconductor memory device according to the present embodiment, data 0 to 2 are allocated such that data areas 51 to 53 defined by the threshold voltage differences ΔVth1 to ΔVth3 do not overlap other data areas until the end of the product life. At this point, in the semiconductor memory device according to the present embodiment, the data is defined using a difference between the threshold voltages of the two memory cells, thereby reducing the influence of the fluctuations (retention fluctuations) the threshold voltages of the memory cells. In other words, the fluctuations in the threshold voltage differences ΔVth1 to ΔVth3 of the two memory cells are smaller than the retention fluctuations of the memory cells, so that the data areas 51 to 53 can be reduced in width.

In other words, in the semiconductor memory device according to the present embodiment, the data is defined using the threshold voltage differences ΔVth1 to ΔVth3, so that the threshold voltages Vth2 to Vth4 set for the memory cell B are allowed to overlap the ranges of other threshold voltages (that is, values from the time of writing of the threshold voltages to the end of the product life) until the end of the product life (See the left side of FIG. 4). Thus, the intervals among the threshold voltages Vth2 to Vth4 set for the memory cell B can be reduced so as to suppress an increase in the threshold voltages set for the memory cell.

Furthermore, in the semiconductor memory device according to the present embodiment, the intervals among the threshold voltages Vth2 to Vth4 set for the memory cell B can be reduced so as to increase the number of data segments defined for the memory cell pair.

Figures 5, 6:
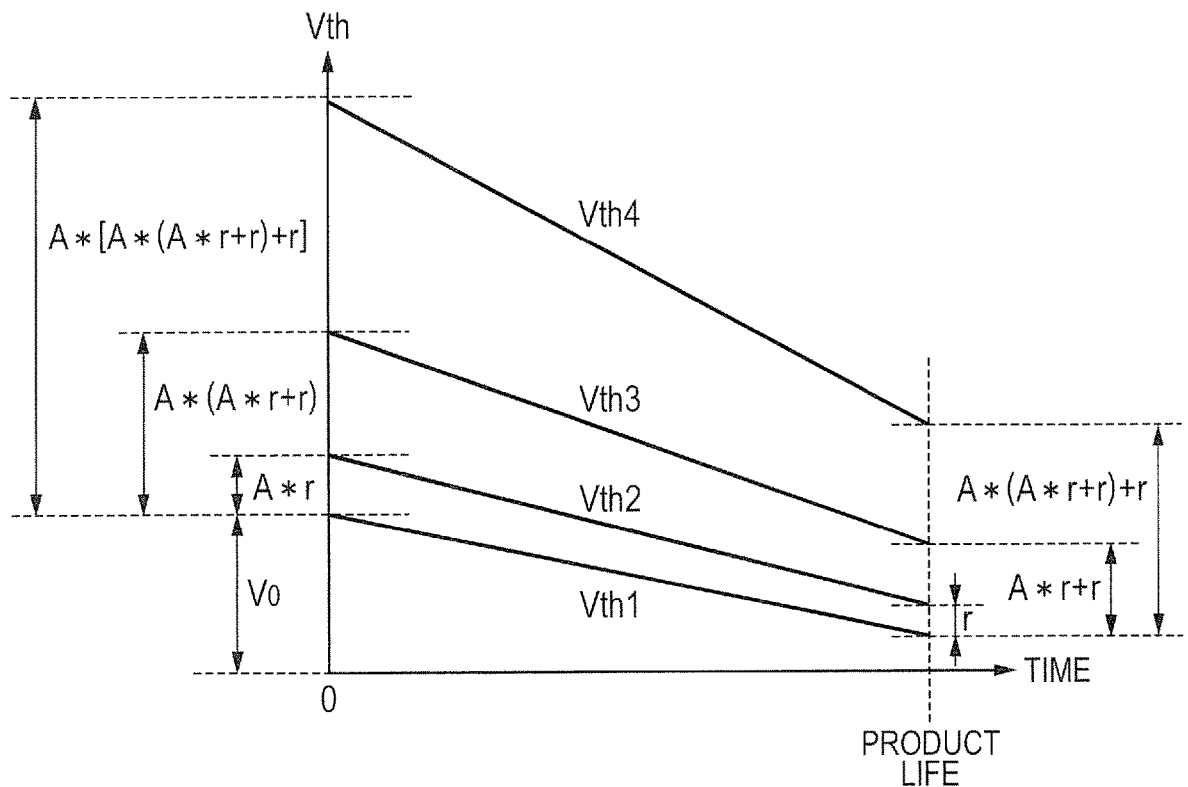
FIG. 5 shows an example of data definition in a semiconductor memory device according to a first embodiment.
FIG. 6 is a table showing the example of data definition in the semiconductor memory device according to the first embodiment.

FIG. 5 shows an example of data definition in the semiconductor memory device according to the present embodiment. FIG. 6 is a table showing an example of data definition in the semiconductor memory device according to the present embodiment. The range upper limits and the range lower limits of the threshold voltage differences ΔVth1 to ΔVth3 are defined. In this case, the range upper limits are the values of the threshold voltage differences ΔVth1 to ΔVth3 immediately after writing to the memory cell and the range lower limits are the values of the threshold voltage differences ΔVth1 to ΔVth3 at the end of the product life of the memory cell.

In the examples of data definition in FIGS. 5 and 6, the range upper limits and the range lower limits of the threshold voltage differences Vth1 to ΔVth3 are defined using the resolution r and the difference reduction rate A. In this case, the resolution r corresponds to a difference between the range upper limit of a threshold voltage difference ΔVth_N (N is a natural number) and the range lower limit of a threshold voltage difference ΔVth_N+1 (See the right side of FIG. 4). The resolution r is defined as a constant value regardless of the value of N.

The difference reduction rate A is the ratio of a difference between the range upper limits of two adjacent threshold voltages to a difference between the range lower limits of the two adjacent threshold voltages. Specifically, the difference reduction rate A=a/b can be defined where a is a difference between the range upper limit of the threshold voltage Vth_N (N is a natural number) and the range upper limit of the threshold voltage Vth_N+1 and b is a difference between the range lower limit of the threshold voltage Vth_N (N is a natural number) and the range lower limit of the threshold voltage Vth_N+1 (See FIG. 5). The difference reduction rate A is defined as a constant rate regardless of the value of N.

As shown in FIGS. 5 and 6, the range lower limit value of the threshold voltage difference ΔVth1 (=Vth2−Vth1) is a difference r (corresponding to the resolution r) between the range lower limit value of the threshold voltage Vth2 and the range lower limit value of the threshold voltage Vth1. Moreover, the range upper limit of the threshold voltage difference ΔVth1 is "A*r", a value determined by multiplying the range lower limit r of the threshold voltage difference Vth1 by the difference reduction rate A. Furthermore, the data of the threshold voltage difference ΔVth1 in this range is defined as "0".

The range lower limit of the threshold voltage difference ΔVth2 (=Vth3−Vth1) is "A*r+r", a value determined by adding the resolution r to the range upper limit of the threshold voltage difference ΔVth1. Moreover, the range upper limit of the threshold voltage difference ΔVth2 is "A*(A*r+r)", a value determined by multiplying the range lower limit A*r+r of the threshold voltage difference ΔVth2 by the difference reduction rate A. Furthermore, the data of the threshold voltage difference ΔVth2 in this range is defined as "1".

The range lower limit of the threshold voltage difference ΔVth3 (=Vth4−Vth1) is "A*(A*r+r)+r", a value determined by adding the resolution r to the range upper limit of the threshold voltage difference ΔVth2. Moreover, the range upper limit of the threshold voltage difference ΔVth3 is "A*[A*(A*r+r)+r]", a value determined by multiplying the range lower limit A*(A*r+r)+r of the threshold voltage difference ΔVth3 by the difference reduction rate A. Furthermore, the data of the threshold voltage difference ΔVth3 in this range is defined as "2".

FIG. 6 shows the definition example of ternary data. In the generalization of the definition, a voltage range $V_b$ necessary for defining N-value data in each memory cell can be expressed by equation (2) below:

[Equation 2]

$$V_b = V_0 + A\left(\frac{A^N - 1}{A - 1}\right)r \qquad (2)$$

As expressed in equation (2), in the semiconductor memory device according to the present embodiment, the voltage range $V_b$ necessary for defining N-value data in each memory cell is irrelevant to fluctuations in the threshold voltage of the memory cell (retention fluctuation: see $d_1$ in equation (1)). This can suppress an increase in the threshold voltage set for the memory cell.

FIG. 7 shows simulation results of the relationship between the number of data segments defined for the memory cell and a required voltage range. FIG. 7 shows the relationship between the number of data segments and a required voltage range $V_a$ according to the related art and the relationship between the number of data segments and the required voltage range $V_b$ according to the present embodiment. In the simulation results of FIG. 7, for example, parameters with relatively high degrees of deterioration are used. Specifically, voltage value $V_0$=2.0 V, retention fluctuation d1=1.0 V, resolution r=0.1 V, and difference reduction rate A=2.0 are set.

As shown in FIG. 7, the present embodiment can obtain a lower required voltage range than the related art. In other words, according to the related art, as the number of data segments defined for the memory cell increases, the required voltage range $V_a$ considerably rises. In contrast, according to the present embodiment, even if the number of data segments defined for the memory cell increases, the required voltage range $V_b$ does not considerably rise but gradually increase.

In this way, as compared with the related art, the semiconductor memory device according to the present embodiment can suppress an increase in the threshold voltage set for the memory cell. If the retention fluctuation $d_1$ is sufficiently larger than the resolution r, in particular, the semiconductor memory device according to the present embodiment can remarkably suppress an increase in the threshold voltage set for the memory cell.

Since the semiconductor memory device according to the present embodiment can suppress an increase in the threshold voltage set for the memory cell, the number of data segments that can be defined for the memory cell pair can be increased. Specifically, as shown in FIG. 7, even if the number of data segments defined for the memory cell increases, the required voltage range $V_b$ does not considerably rise but gradually increase according to the present embodiment, thereby increasing the number of data segments that can be defined form the memory cell pair.

In other words, as indicated on the right side of FIG. 4, the fluctuations in the threshold voltage differences ΔVth1 to ΔVth3 of the two memory cells are smaller than the retention fluctuations of the memory cells in the semiconductor memory device according to the present embodiment. Thus, the widths of the data areas 51 to 53 can be reduced, thereby increasing the number of data segments that can be defined for the memory cell pair.

In the semiconductor memory device according to the present embodiment, the two memory cells are used as a memory cell pair. Thus, by storing at least four-valued data in the memory cell pair, the data density is at least as high as that of binary data stored in the memory cell.

A configuration example of the semiconductor memory device according to the present embodiment will be discussed below. FIG. 8 is a block diagram showing the configuration example of the semiconductor memory device according to the present embodiment. As shown in FIG. 8, a semiconductor memory device 1 according to the present embodiment includes a memory array 11, a threshold voltage detecting unit 12, and a memory controller 13. The memory cell array 11 includes 2n memory cells MC1 to MC2n (n is a natural number). The memory cell MC1 and the memory cell MC2 constitute a memory cell pair 14_1, the memory cell MC3 and the memory cell MC4 constitute a memory cell pair 14_2, and the memory cell MC2n−1 and the memory cell MC2n constitute a memory cell pair 14_n. In other words, the memory array 11 includes the n memory cell pairs 14_1 to 14_n.

The memory cells MC1 to MC2n are configured so as to set predetermined threshold voltages. For example, the memory cells MC1, MC3, . . . MC2n−1 of the memory cell pairs 14_1 to 14_n are configured so as to set at least one threshold voltage, whereas the memory cells MC2, MC4, . . . , MC2n are configured so as to set multiple threshold voltages.

The semiconductor memory device 1 according to the present embodiment is, for example, flash memory. In the flash memory, a threshold voltage changes according to the quantity of electric charge flowing to a floating gate provided for each of the memory cells MC1 to MC2n. Specifically, the larger the quantity of electric charge flowing to the floating gate, the higher the threshold voltage. In the semiconductor memory device according to the present embodiment, the quantity of charge flowing to the floating gate is adjusted so as to set the threshold voltages of the memory cells MC1 to MC2n at a predetermined value.

Moreover, in the semiconductor memory device 1 according to the present embodiment, the memory cells MC1 to MC2n are not particularly limited as long as the threshold voltages can be set at the predetermined value. For example, the present embodiment is also applicable to a metal-oxide-nitride-oxide-silicon (MONOS) flash memory. Furthermore, the present embodiment is also applicable to other kinds of flash memory. For simplicity, the memory cells MC1 to MC2n are arranged in a row in FIG. 8. Actually, the memory cells are arranged in a matrix.

The threshold voltage detecting unit 12 detects threshold voltages Vth_MC1 to Vth_MC2n set for the memory cells MC1 to MC2n. For example, the threshold voltage detecting unit 12 is a sense amplifier. The threshold voltage detecting unit 12 detects a cell current flowing during reading on the memory cells MC1 to MC2n, thereby detecting the threshold voltages Vth_MC1 to Vth_MC2n set for the memory cells MC1 to MC2n. In other words, the higher the threshold voltage Vth set for the memory cell MC, the smaller the cell current flowing to the memory cell MC. Thus, the threshold voltage detecting unit 12 can detect the threshold voltage Vth set for the memory cell MC, by detecting the amount of the cell current. Information on the threshold voltages Vth_MC1 to Vth_MC2n detected by the threshold voltage detecting unit 12 is supplied to the memory controller 13.

The memory controller 13 controls reading of data from the memory cells MC1 to MC2n included in the memory array 11. Specifically, the memory controller 13 reads data stored in each of the memory cell pairs by using a difference between the threshold voltage of one of the memory cells and the threshold voltage of the other memory cell in each of the memory cell pairs 14_1 to 14_n.

Moreover, the memory controller 13 controls writing and erasure of data in the memory cells MC1 to MC2n included in the memory array 11.

FIG. 9 is a block diagram showing a configuration example of the memory controller included in the semiconductor memory device according to the present embodiment. As shown in FIG. 9, the memory controller 13 includes a threshold voltage determining unit 21, a memory cell control unit 22, a voltage difference calculating unit 23, and a data converting unit 24.

The threshold voltage determining unit 21 determines the threshold voltages Vth_MC1 to Vth_MC2n set (written) for the memory cells MC1 to MC2n, based on inputted written data. For example, as shown in FIG. 10, the threshold voltage determining unit 21 includes a table in which data and threshold voltages are associated with each other. The threshold voltage determining unit 21 determines the threshold voltages of the memory cells according to the inputted written data 0 to 2. For example, if "data 2" is written in the memory cell pair including the memory cells MC1 and MC2, the threshold voltage determining unit 21 determines "Vth1" as a threshold voltage set for the memory cell MC1 and determines "Vth4" as a threshold voltage set for the memory cell MC2. The threshold voltages determined by the threshold voltage determining unit 21 are supplied to the memory cell control unit 22.

The memory cell control unit 22 sets (writes) the threshold voltages Vth_MC1 to Vth_MC2$n$ determined by the threshold voltage determining unit 21, in the memory cells MC1 to MC2$n$. The memory cells MC1 to MC2$n$ where the data is written are selected using a row decoder (not shown) and a column decoder (not shown).

The voltage difference calculating unit 23 calculates a difference between the threshold voltages of two memory cells constituting each of the memory cell pairs 14_1 to 14_n. For example, the voltage difference calculating unit 23 calculates a difference between the threshold voltage Vth_MC1 of the memory cell MC1 and the threshold voltage Vth_MC2 of the memory cell MC2, the memory cells MC1 and MC2 constituting the memory cell pair 141_1. The calculated threshold voltage difference ΔVth is supplied to the data converting unit 24. Typically, the voltage difference calculated at this point is the absolute value of the threshold voltage difference (ΔVth>0).

The data converting unit 24 converts the threshold voltage difference ΔVth calculated by the voltage difference calculating unit 23, to data corresponding to the threshold voltage difference ΔVth. For example, as shown in FIG. 10, the data converting unit 24 includes the table in which the threshold voltage differences ΔVth1 to ΔVth3 and the data 0 to 2 are associated with each other. The converting unit 24 outputs, as read data, the data corresponding to the calculated threshold voltage difference ΔVth. For example, if the threshold voltage difference ΔVth read from the memory cell pair including the memory cells MC1 and MC2 is "ΔVth2", the data converting unit 24 reads "data 1" and outputs "data 1" as data.

The threshold voltage differences ΔVth1 to ΔVth3 are ranged values and thus can be defined using the range lower limits and the range upper limits in FIG. 6.

A data writing sequence and a data reading sequence of the semiconductor memory device 1 according to the present embodiment will be described below.

Figure 11:
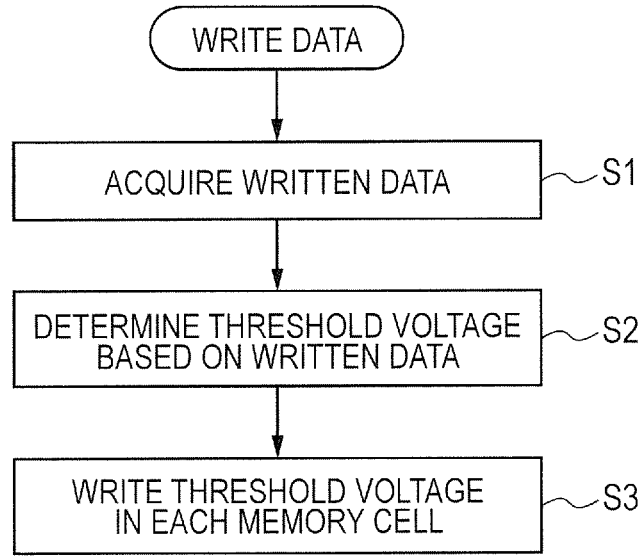
FIG. 11 is a flowchart showing a sequence of data writing in the semiconductor memory device according to the first embodiment.

First, referring to FIG. 11, the data writing sequence of the semiconductor memory device 1 according to the present embodiment will be described below. When data is written to the memory cells MC1 to MC2$n$, the semiconductor memory device 1 acquires written data (step S1). Specifically, the written data is supplied to the threshold voltage determining unit 21 included in the memory controller 13 shown in FIG. 9.

The threshold voltage determining unit 21 then determines the threshold voltages Vth_MC1 to Vth_MC2$n$ set for the memory cells MC1 to MC2$n$, based on the inputted written data (step S2). For example, as shown in FIG. 10, the threshold voltage determining unit 21 includes the table in which the data and threshold voltages are associated with each other. The threshold voltage determining unit 21 determines the threshold voltages of the memory cells according to the inputted written data 0 and 1. The threshold voltages Vth_MC1 to Vth_MC2$n$ determined by the threshold voltage determining unit 21 are supplied to the memory cell control unit 22.

The memory cell control unit 22 then writes the threshold voltages Vth_MC1 to Vth_MC2$n$ determined by the threshold voltage determining unit 21, in the memory cells MC1 to MC2$n$ (step S3).

Figure 12:
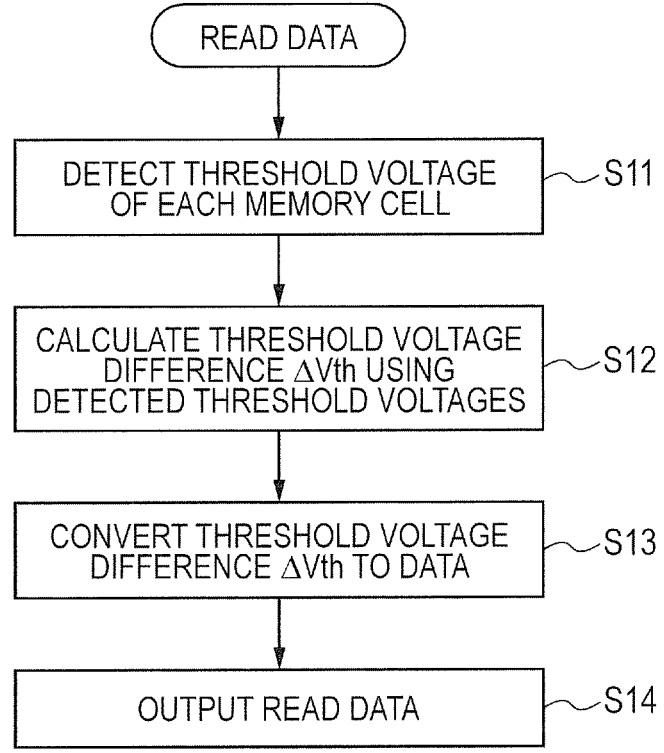
FIG. 12 is a flowchart showing a sequence of data reading in the semiconductor memory device according to the first embodiment.

Subsequently, referring to FIG. 12, the data reading sequence of the semiconductor memory device 1 according to the present embodiment will be described below. When data is read from the memory cells MC1 to MC2$n$, the semiconductor memory device 1 detects the threshold voltages Vth_MC1 to Vth_MC2$n$ set for the memory cells MC1 to MC2$n$, by means of the threshold voltage detecting unit 12 (step S11).

Thereafter, the voltage difference calculating unit 23 calculates a difference ΔVth between the threshold voltages from Vth_MC1 to Vth_MC2$n$ that are set for the memory cells MC1 to MC2$n$ and are supplied from the threshold voltage detecting unit 12 (step S12). The calculated threshold voltage difference ΔVth is supplied to the data converting unit 24.

The data converting unit 24 then converts the threshold voltage difference ΔVth calculated by the voltage difference calculating unit 23, to data corresponding to the threshold voltage difference ΔVth (step S13). For example, as shown in FIG. 10, the data converting unit 24 includes the table in which the threshold voltage differences ΔVth1 to ΔVth3 and the data 0 to 2 are associated with each other. The converting unit 24 converts the calculated threshold voltage difference ΔVth to data corresponding to the threshold voltage difference ΔVth.

The memory controller 13 then outputs the converted data as read data (step S14).

The configuration of the semiconductor memory device 1 shown in FIGS. 8 and 9 is merely exemplary. The semiconductor memory device according to the present embodiment may have other configurations.

The embodiment can provide a semiconductor memory device capable of storing multi-value data while suppressing an increase in the threshold voltage set for a memory cell, and a method of defining data in the semiconductor memory device.

Second Embodiment

A second embodiment will be described below. FIG. 13 is a table showing an example of data definition in a semiconductor memory device according to the second embodiment. In the semiconductor memory device according to the second embodiment, a method of defining data is different from that of the semiconductor memory device according to the first embodiment. Other points are similar to those of the semiconductor memory device according to the first embodiment and thus the repeated explanation thereof is omitted.

As shown in FIG. 13, the semiconductor memory device according to the present embodiment is configured so as to set a reference threshold voltage Vth1 and threshold voltages Vth2 to Vth4 as threshold voltages Vth for a memory cell A of a memory cell pair. Moreover, the semiconductor memory device is configured so as to set the reference threshold voltage Vth1 and the threshold voltages Vth2 to Vth4 as threshold voltages Vth for the other memory cell B.

In the present embodiment, data stored in the memory cell pair are including the memory cell A and the memory cell B is defined using differences between the threshold voltages Vth2 to Vth4 of the memory cell B and the reference threshold voltage Vth1 of the memory cell A and differences between the threshold voltages Vth2 to Vth4 and the reference threshold voltage Vth1 the memory cell B.

Specifically, as indicated by reference numeral 31 in FIG. 13, "data 0" is defined using a difference between the threshold voltage Vth2 of the memory cell B and the reference threshold voltage Vth1 of the memory cell A, "data 1" is defined using a difference between the threshold voltage Vth3 of the memory cell B and the reference threshold voltage Vth1 of the memory cell A, and "data 2" is defined using a difference between the threshold voltage Vth4 of the memory cell B and the reference threshold voltage Vth1 of the memory cell A.

Moreover, as indicated by reference numeral 32 in FIG. 13, "data 3" is defined using a difference between the threshold voltage Vth2 of the memory cell A and the reference threshold voltage Vth1 of the memory cell B, "data 4" is defined using a difference between the threshold voltage Vth3 of the memory cell A and the reference threshold voltage Vth1 of the memory cell B, and "data 5" is defined using a difference between the threshold voltage Vth4 of the memory cell A and the reference threshold voltage Vth1 of the memory cell B.

In the present embodiment, the threshold voltages Vth1 to Vth4 of the memory cell A are set for the respective threshold voltages Vth1 to Vth4 of the memory cell B. The threshold voltages relevant to each other are set at the same value by definition. However, because of variations in the threshold voltages actually written in the memory cells, the threshold voltages Vth1 to Vth4 of the memory cell A and the threshold voltages Vth1 to Vth4 of the memory cell B may be slightly displaced from each other. For example, even if the threshold voltage Vth1 of the memory cell A and the threshold voltage Vth1 of the memory cell B are defined as the same value, the threshold voltages Vth1 actually written in the memory cell A and the threshold voltage Vth1 actually written in the memory cell B are slightly displaced from each other.

For convenience, the threshold voltages Vth1 to Vth4 of the memory cell A are defined as the same values as the respective threshold voltages Vth1 to Vth4 of the memory cell B in the present specification. For this reason, the threshold voltages Vth1 to Vth4 actually written in the memory cell A and the threshold voltages Vth1 to Vth4 actually written in the memory cell B are slightly displaced from each other (displacement at a permissible level).

In the present embodiment, the threshold voltages Vth1 to Vth4 of the memory cell A and the respective threshold voltages Vth1 to Vth4 of the memory cell B may be defined as different values as long as the definition of data is not affected.

In the semiconductor memory device according to the first embodiment, the reference threshold voltage Vth1 is set for one of the two memory cells constituting the memory cell pair, whereas in the semiconductor memory device according to the present embodiment, the reference threshold voltage Vth1 is set for each of the two memory cells A and B constituting the memory cell pair. This can increase the amount of data stored in the memory cell pair.

Generally, the number of data segments that can be defined for the memory cell pair is expressed as "(M−1)×2" where M (M is an integer of at least 2) the number of threshold voltages Vth that can be set for the single memory cell. In the semiconductor memory device according to the present embodiment, the two memory cells are used as a memory cell pair. Thus, by storing at least four-valued data in the memory cell pair, the data density is at least as high as that of binary data stored in the memory cell. Thus, if M is at least 3 in the present embodiment, the data density is at least as high as that of binary data stored in the memory cell.

Third Embodiment

A third embodiment will be described below. FIG. 14 is a table showing an example of data definition in a semiconductor memory device according to the third embodiment. In the semiconductor memory device according to the third embodiment, a method of defining data is different from those of the semiconductor memory devices according to the first and second embodiments. Other points are similar to those of the semiconductor memory devices according to the first and second embodiments and thus the repeated explanation thereof is omitted.

As shown in FIG. 14, the semiconductor memory device according to the present embodiment, is configured so as to set threshold voltages Vth1 to Vth4 for two memory cells A and B constituting a memory cell pair. Data stored in the memory cell pair is defined using threshold voltage differences that are calculated using the threshold voltages Vth1 to Vth4 of the of the memory cell A and the threshold voltages Vth1 to Vth4 of the memory cell B.

In other words, in the second embodiment, the reference threshold voltage Vth1 of the memory cell A and the threshold voltage Vth1 of the memory cell B are used as reference threshold voltages, whereas in the present embodiment, the threshold voltages Vth1 to Vth4 set for the memory cells are used as reference threshold voltages. In other words, in the present embodiment, data is defined using combination patterns of the threshold voltages Vth1 to Vth4 of the of the memory cell A and the threshold voltages Vth1 to Vth4 of the memory cell B.

Specifically, as shown in FIG. 14, "data 0" is defined using a difference between the threshold voltage Vth2 of the memory cell B and the threshold voltage Vth1 of the memory cell A, "data 1" is defined using a difference between the threshold voltage Vth3 of the memory cell B and the threshold voltage Vth1 of the memory cell A, and "data 2" is defined using a difference between the threshold voltage Vth4 of the memory cell B and the threshold voltage Vth1 of the memory cell A. Moreover, "data 3" is defined using a difference between the threshold voltage Vth3 of the memory cell B and the threshold voltage Vth2 of the memory cell A, "data 4" is defined using a difference between the threshold voltage Vth4 of the memory cell B and the threshold voltage Vth2 of the memory cell A, and "data 5" is defined using a difference between the threshold voltage Vth4 of the memory cell B and the threshold voltage Vth3 of the memory cell A.

Furthermore, as shown in FIG. 14, "data 6" is defined using a difference between the threshold voltage Vth2 of the memory cell A and the threshold voltage Vth1 of the memory cell B, "data 7" is defined using a difference between the threshold voltage Vth3 of the memory cell A and the threshold voltage Vth1 of the memory cell B, and "data 8" is defined using a difference between the threshold voltage Vth4 of the memory cell A and the threshold voltage Vth1 of the memory cell B. Moreover, "data 9" is defined using a difference between the threshold voltage Vth3 of the memory cell A and the threshold voltage Vth2 of the memory cell B, "data 10" is defined using a difference between the threshold voltage Vth4 of the memory cell A and the threshold voltage Vth2 of the memory cell B, and "data 11" is defined using a difference between the threshold voltage Vth4 of the memory cell A and the threshold voltage Vth3 of the memory cell B.

FIG. 15 shows an example of data definition in the semiconductor memory device according to the present embodiment. A table in FIG. 15 shows the threshold voltages of the memory cell A, the threshold voltages of the memory cell B, the range upper limits and range lower limits of differences between the threshold voltages of the memory cell B and the threshold voltages of the memory cell A, and the correspondence of data. A resolution r and a difference reduction rate A are similar to those of the first embodiment.

As shown in FIG. 15, "data 0" is defined using a difference between the threshold voltage Vth2 of the memory cell B and the threshold voltage Vth1 of the memory cell A. At this point, the range lower limit is "r" and the range upper limit is "A*r". "Data 1" is defined using a difference between the threshold voltage Vth3 of the memory cell B and the threshold voltage Vth1 of the memory cell A. At this point, the range lower limit is "A*r+r" and the range upper limit is "A*(A*r+r)". "Data 2" is defined using a difference between the threshold voltage Vth4 of the memory cell B and the threshold voltage Vth1 of the memory cell A. At this point, the range lower limit is "A*(A*r+r)+r" and the range upper limit is "A*[A*(A*r+r)+r]".

"Data 3" is defined using a difference between the threshold voltage Vth3 of the memory cell B and the threshold voltage Vth2 of the memory cell A. At this point, the range lower limit is "A*r" and the range upper limit is "A*r*r". "Data 4" is defined using a difference between the threshold voltage Vth4 of the memory cell B and the threshold voltage Vth2 of the memory cell A. At this point, the range lower limit is "A*(A*r+r)" and the range upper limit is "A*A*(A*r+r)". "Data 5" is defined using a difference between the threshold voltage Vth4 of the memory cell B and the threshold voltage Vth3 of the memory cell A. At this point, the range lower limit is "A*A*r" and the range upper limit is "A*A*A*r".

FIG. 15 shows, as an example, the range lower limits and the range upper limits in the definition example of data 0 to 5. The range lower limits and the range upper limits in the definition example of data 6 to 11 can be similarly defined.

In the present embodiment, as shown in FIG. 14, the absolute value of the threshold voltage difference of "data 0" and the absolute value of the threshold voltage difference of "data 6" are equal to each other. The data can be discriminated from the other according to the magnitudes of the threshold voltages of the memory cells A and B. In other words, the threshold voltages have the relationship of Vth1<Vth2<Vth3<Vth4. Thus, if the threshold voltage of the memory cell A is smaller than the threshold voltage of the memory cell B, that is, if the threshold voltage of the memory cell A is Vth1 and the threshold voltage of the memory cell B is Vth2, "data 0" can be decided. Conversely, if the threshold voltage of the memory cell A is larger than the threshold voltage of the memory cell B, that is, if the threshold voltage of the memory cell A is Vth2 and the threshold voltage of the memory cell B is Vth1, "data 6" can be determined.

In the present embodiment, "data 0" and "data 6" may be discriminated from each other depending on whether a threshold voltage difference between the memory cells A and B is positive or negative. Specifically, when (the threshold voltage of the memory cell B)−(the threshold voltage of the memory cell A) is calculated, "data 0" may be determined for a positive value and "data 6" can be determined for a negative value.

This holds true for the relationship between the data 1 and the data 7, the relationship between the data 2 and the data 8, the relationship between the data 3 and the data 9, the relationship between the data 4 and the data 10, and the relationship between the data 5 and the data 11.

In the second embodiment, the threshold voltage Vth1 of the memory cell A and the threshold voltage Vth1 of the memory cell B are each used as a reference threshold voltage, whereas in the present embodiment, the threshold voltages Vth1 to Vth4 set for the memory cells can be each used as a reference threshold voltage. In other words, in the present embodiment, data is defined using combination patterns of the threshold voltages Vth1 to Vth4 of the of the memory cell A and the threshold voltages Vth1 to Vth4 of the memory cell B. This can increase the amount of data stored in the memory cell pair as compared with the second embodiment.

Figure 16:
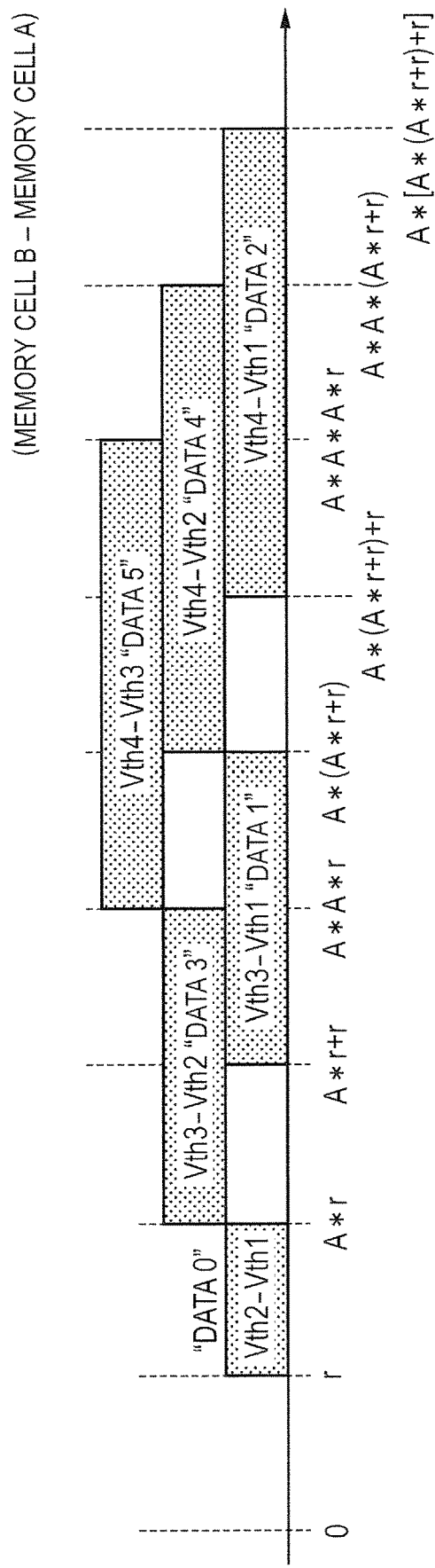
FIG. 16 shows an example of data definition in the semiconductor memory device according to the third embodiment.

FIG. 16 shows an example of data definition in the semiconductor memory device according to the present embodiment. FIG. 16 shows the ranges of threshold voltage differences for defining data 0 to 5. Specifically, the ranges of threshold voltage differences (that is, the ranges from the range lower limit to the range upper limit) for the data 0 to 5 in table of FIG. 15.

In the present embodiment, in the definition of the data, the ranges of the threshold voltage differences for the data are preferably defined without overlapping one another. However, the ranges of the threshold voltage differences for the data may overlap one another depending on the threshold voltages Vth defined for the memory cells. For example, in the data definition example of FIG. 16, the ranges of the threshold voltage differences for defining the data may partially overlap one another. One example is that the range of the threshold voltage difference of the data 1 and the range of the threshold voltage difference of the data 3 overlap each other from a threshold voltage difference "A*r+r" to "A*r*r".

Figure 17:
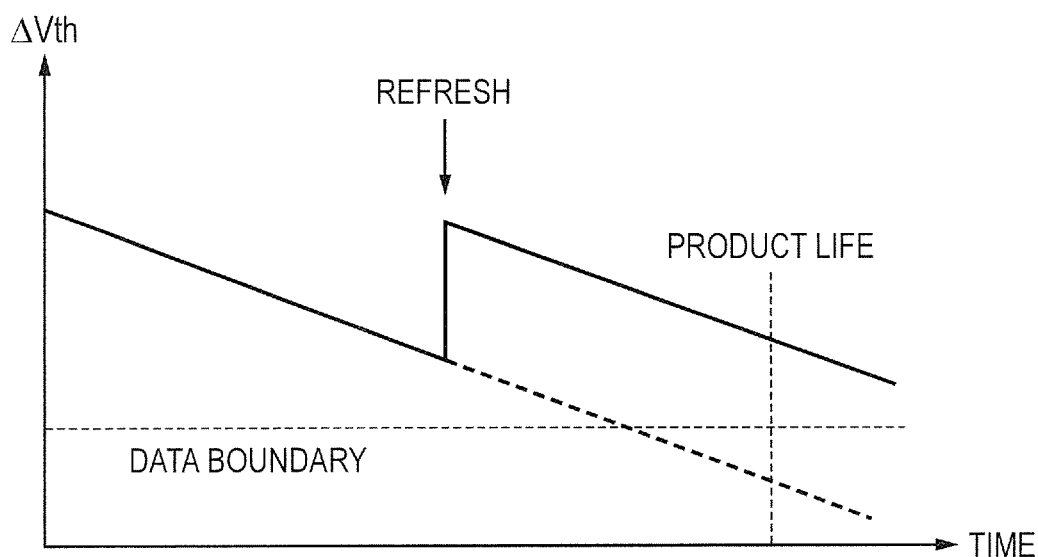
FIG. 17 is an explanatory drawing of a refreshing operation in the semiconductor memory device according to the third embodiment.

Such an overlap between the ranges of threshold voltage differences can be eliminated by, for example, periodically refreshing data. FIG. 17 is an explanatory drawing of a refreshing operation. As shown in FIG. 17, after the data is written in the memory cells, that is, after the threshold voltages are set for the memory cells, the threshold voltage difference ΔVth for defining the data gradually decreases with the passage of time (See the right side of FIG. 4). Immediately after the data is written, the threshold voltage difference ΔVth for defining the data does not enter other data areas. However, as the threshold voltage difference ΔVth decreases with the passage of time, the threshold voltage difference ΔVth enters other data areas over a data boundary (See a broken line in FIG. 17).

In the refreshing operation of FIG. 17, the refreshing operation is performed before the threshold voltage difference ΔVth crosses the data boundary, the threshold voltage difference ΔVth is reset to the initial value. Specifically, in the refreshing operation of FIG. 17, the data written in the memory cell pair is read and confirmed once before the data is changed (in other words, before the threshold voltage difference ΔVth crosses the data boundary), and then the same data is rewritten in the memory cell pair.

The refreshing operation can avoid an overlap between the threshold voltage differences ΔVth for defining the data. In other words, the refreshing operation is periodically performed to reset the threshold voltage difference ΔVth to the initial value, thereby substantially reducing the ranges of the threshold voltage differences ΔVth for defining the data.

This can avoid an overlap between the threshold voltage differences ΔVth for defining the data.

Specifically, the threshold voltage difference of the data 1 in FIG. 16 is "A*(A*r+r)" (range upper limit) immediately after the writing of the data. The threshold voltage difference decreases with the passage of time. In the present embodiment, the refreshing operation is performed before the threshold voltage difference reaches "A*A*r", the range upper limit of the data 3, thereby preventing the threshold voltage difference of the data 1 from entering the range of threshold voltage difference of the data 3.

Furthermore, in the semiconductor memory device according to the present embodiment, data stored in the memory cell pair may be defined using the sum of the threshold voltages, the sum being calculated using the threshold voltages Vth1 to Vth4 of the of the memory cell A and the threshold voltages Vth1 to Vth4 of the memory cell B.

As described above, in the present embodiment, the ranges of the threshold voltage differences for the data are preferably defined without overlapping one another in the definition of the data. However, the ranges of the threshold voltage differences for the data may overlap one another depending on the threshold voltages Vth defined for the memory cells (See FIG. 16).

In the present embodiment, the data is defined using the sum of the threshold voltages of the memory cells in addition to a difference between the threshold voltages of the memory cells, thereby solving the above-mentioned problem.

Specifically, the range of the sum of the threshold voltages for defining the data 1 to 5 is shifted to the high voltage side as compared with the range of threshold voltage differences for defining the data 1 to 5 shown in FIG. 16. Thus, the sum of the threshold voltages for defining the data is determined so as to shift the range of threshold voltages for defining data, thereby preventing an overlap between the ranges of differences and the sum of threshold voltages for defining the data.

As described above, the data is defined by combining the threshold voltage differences and the sum of the threshold voltages, thereby uniquely defining the data even if the ranges of threshold voltage differences for defining the data overlap each other.

Fourth Embodiment

Figure 18:
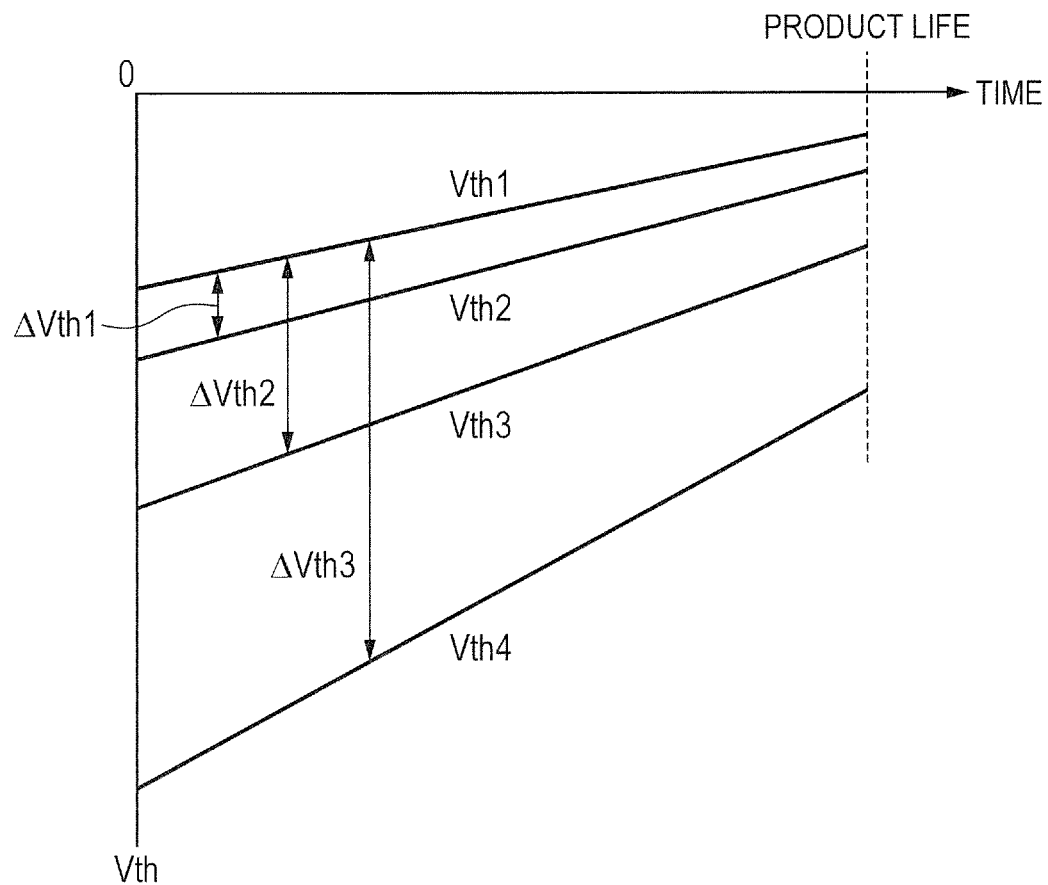
FIG. 18 shows an example of data definition in a semiconductor memory device according to the fourth embodiment.

A fourth embodiment will be described below. FIG. 18 shows an example of data definition in a semiconductor memory device according to the fourth embodiment. The semiconductor memory device according to the fourth embodiment is different from the semiconductor memory devices according to the first to third embodiments in that data is defined using negative threshold voltages. Other points are similar to those of the semiconductor memory devices according to the first to third embodiments and thus the repeated explanation thereof is omitted.

In the semiconductor memory device according to the present embodiment, a memory cell pair including a memory cell A and a memory cell B is used as a memory unit. Multi-value data is stored in the memory unit (memory cell pair). Specifically, as shown in FIG. 18, a reference threshold voltage Vth1 is set for the memory cell A and threshold voltages Vth2 to Vth4 are set for the other memory cell B. The data is defined using differences ΔVth1 to ΔVth3 between the threshold voltages Vth2 to Vth4 of the memory cell B and the threshold voltage Vth1 of the memory cell A.

As shown in FIG. 18, the threshold voltages Vth1 to Vth4 are set so as to decrease in the order of the threshold voltage Vth1, the threshold voltage Vth2, the threshold voltage Vth3, and the threshold voltage Vth4. The threshold voltages Vth1 to Vth4 are negative values. Thus, the threshold voltage difference ΔVth1 can be determined by ΔVth1=Vth1−Vth2, the threshold voltage difference ΔVth2 can be determined by ΔVth2=Vth1−Vth3, and the threshold voltage difference ΔVth3 can be determined by ΔVth3=Vth1−Vth4.

The present embodiment is similar to the explanation of the first embodiment (See FIGS. 4 to 6) except that the threshold voltages Vth1 to Vth4 are negative values, and thus the repeated explanation thereof is omitted.

Figure 19:
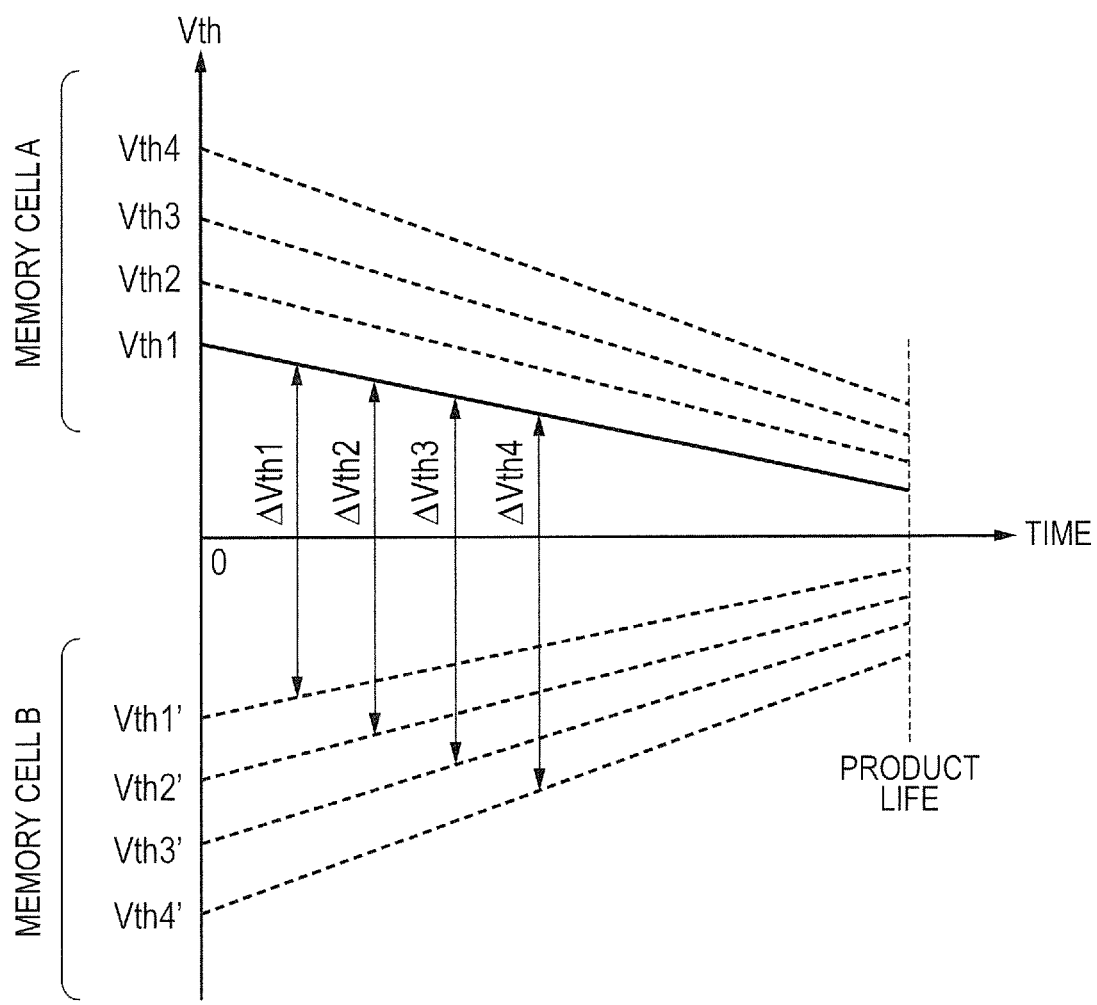
FIG. 19 shows an example of data definition in the semiconductor memory device according to the fourth embodiment.

FIG. 19 shows an example of data definition in the semiconductor memory device according to the present embodiment. In the example of data definition in FIG. 19, one of the two memory cells A and B has a positive threshold voltage value and the other memory cell has negative threshold voltage values.

For example, if the positive threshold voltage Vth1 is set for the memory cell A and negative threshold voltages Vth1' to Vth4 are set for the memory cell B, data can be defined as follows: the data can be defined using differences between a reference threshold voltage, which is the threshold voltage Vth1 of the memory cell A, and the threshold voltages Vth1' to Vth4' of the memory cell B. In the example of FIG. 19, data of four values in total can be defined using the threshold voltage differences ΔVth1 to ΔVth4.

As shown in FIG. 19, if positive threshold voltages Vth1 to Vth4 are set for the memory cell A and negative threshold voltages Vth1' to Vth4' are set for the memory cell B, data can be defined using combinations of these threshold voltages. In this case, a method of defining data is similar to that of the third embodiment (See FIG. 14) and thus the repeated explanation thereof is omitted. If one of the memory cells has positive threshold voltage values and the other memory cell has negative voltage values as in the present embodiment, data can be defined using the threshold voltage Vth1 and the threshold voltage Vth1'. Thus, data can be defined in "invalid" parts in the table of FIG. 14. Hence, as shown in FIG. 19, if the positive threshold voltages Vth1 to Vth4 are set for the memory cell A and the negative threshold voltages Vth1' to Vth4 are set for the memory cell B, data of 16 values in total can be defined.

Fifth Embodiment

Figure 20:
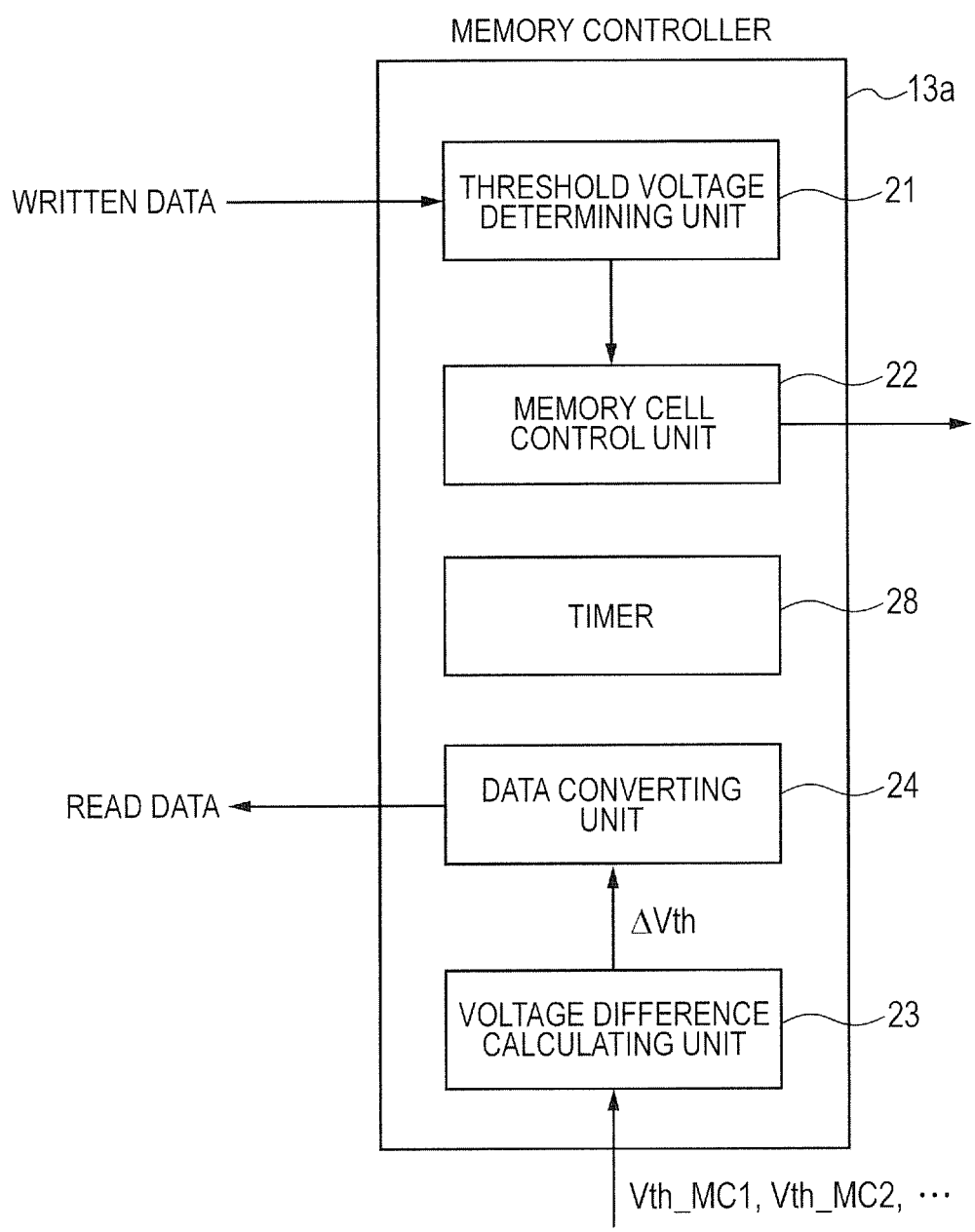
FIG. 20 is a block diagram showing a configuration example of a memory controller included in a semiconductor memory device according to a fifth embodiment.

A fifth embodiment will be described below. FIG. 20 is a block diagram showing a configuration example of a memory controller included in a semiconductor memory device according to the fifth embodiment. As shown in FIG. 20, the semiconductor memory device according to the present embodiment is different from the first to fourth embodiments in that a memory controller 13a includes a timer 28. Other points are similar to those of the semiconductor memory devices according to the first to fourth embodiments and thus the repeated explanation thereof is omitted.

As shown in FIG. 20, the memory controller 13a includes the timer 28. The timer 28 measures an elapsed time from the time of data writing in memory cells. Data stored in a memory cell pair is read by the memory controller 13a by using a threshold voltage difference detected between the memory cells by a threshold voltage detecting unit 12 (See FIG. 8) and an elapsed time measured by the timer.

Figure 21:
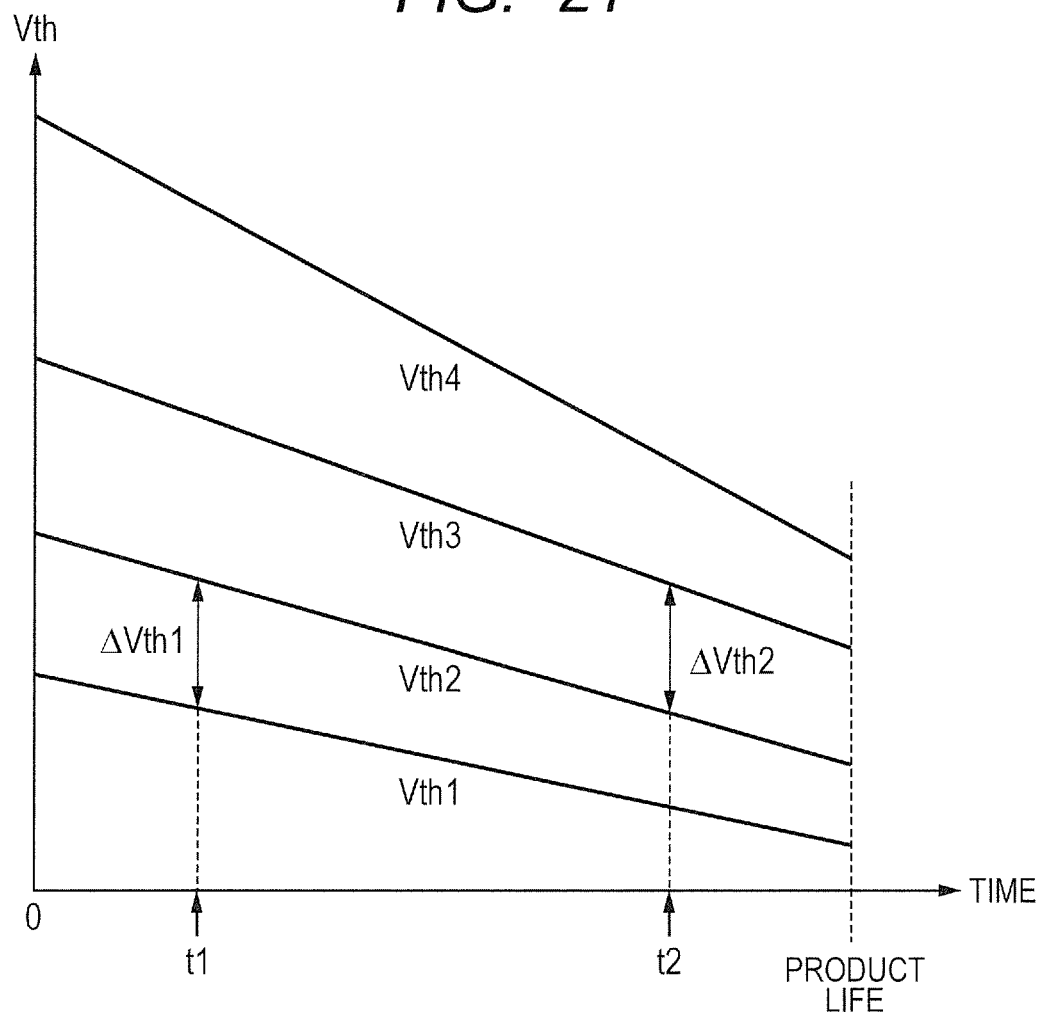
FIG. 21 shows an example of data definition in the semiconductor memory device according to the fifth embodiment.

As indicated in the example of data definition in FIG. 21, if the value of a threshold voltage difference ΔVth1 read at time t1 and the value of a threshold voltage difference ΔVth2 read at time t2 are equal to each other after data is written, data defined by the threshold voltage difference ΔVth1 and data defined by the threshold voltage difference ΔVth2 cannot be discriminated from each other.

In order to solve the problem in the present embodiment, the timer 28 is provided in the memory controller 13a so as to measure the elapsed times t1 and t2 from the time of data writing in the memory cells. Since the elapsed times t1 and t2 measured by the timer 28 are used in addition to the threshold voltage differences ΔVth1 and ΔVth2 during data writing. Thus, even if the values of the threshold voltage difference ΔVth1 and the threshold voltage difference ΔVth2 are equal to each other, data defined by the threshold voltage difference ΔVth1 and data defined by the threshold voltage difference ΔVth2 can be discriminated from each other.

In the presence of the timer 28, the timing of a refreshing operation shown in FIG. 17 (See the third embodiment) can be properly determined.

The timer 28 may be configured so as to measure an elapsed time for each memory cell pair, measure an elapsed time for a predetermined number of memory cell pairs, or measure an elapsed time for an entire memory cell array.

The invention made by the present inventors was specifically described in accordance with the foregoing embodiments. Obviously, the present invention is not limited to the embodiments and various changes can be made within the scope of the invention.

What is claimed is:

1. A semiconductor memory device comprising a plurality of memory cells,
    wherein the memory cells have a plurality of memory cell pairs, each having a first memory cell and a second memory cell,
    wherein the first memory cell is configured so as to set a first threshold voltage,
    wherein the second memory cell is configured so as to set second to fourth threshold voltages, and
    wherein data stored in the memory cell pairs is defined using a difference between the second threshold voltage and the first threshold voltage, a difference between the third threshold voltage and the first threshold voltage, and a difference between the fourth threshold voltage and the first threshold voltage.

2. The semiconductor memory device according to claim 1,
    wherein the first to fourth threshold voltages are set so as to increase in an order of the first threshold voltage, the second threshold voltage, the third threshold voltage, and the fourth threshold voltage, and
    wherein voltage differences are set so as to increase in an order of the difference between the second threshold voltage and the first threshold voltage, the difference between the third threshold voltage and the second threshold voltage, and the difference between the fourth threshold voltage and the third threshold voltage.

3. The semiconductor memory device according to claim 1,
    wherein the threshold voltages of the first and second memory cells are both positive or negative values.

4. The semiconductor memory device according to claim 1,
    wherein the threshold voltage of one of the first and second memory cells is a positive value and the threshold voltage of the other memory cell is a negative value.

5. A semiconductor memory device comprising a plurality of memory cells,
    wherein the memory cells have a plurality of memory cell pairs, each having a first memory cell and a second memory cell,
    wherein the first memory cell is configured so as to set at least one threshold voltage,
    wherein the second memory cell is configured so as to set a plurality of threshold voltages, and
    wherein data stored in the memory cell pairs is defined using differences between the threshold voltages of the second memory cell and the threshold voltage of the first memory cell,
    wherein the semiconductor memory device further comprises:
    a threshold voltage detecting unit that detects the threshold voltages of the memory cells;
    a memory controller that controls the memory cells; and
    a timer that measures an elapsed time from a time of data writing in the first and second memory cells,
    wherein the memory controller reads the data stored in the memory cell pairs, by using differences between the threshold voltages of the second memory cell and the threshold voltage of the first memory cell and the elapsed times measured by the timer, the threshold voltages being detected by the threshold voltage detecting unit.

* * * * *